(12) United States Patent
Nam

(10) Patent No.: US 12,094,521 B2
(45) Date of Patent: Sep. 17, 2024

(54) SYSTEMS AND METHODS FOR CONTROLLING COMMON MODE LEVEL FOR SENSE AMPLIFIER CIRCUITRY

(71) Applicant: Micron Technology, Inc., Boise, ID (US)

(72) Inventor: Ki-Jun Nam, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 207 days.

(21) Appl. No.: 17/884,261

(22) Filed: Aug. 9, 2022

(65) Prior Publication Data

US 2024/0055044 A1 Feb. 15, 2024

(51) Int. Cl.
*G11C 7/08* (2006.01)
*G11C 7/06* (2006.01)
*G11C 11/4091* (2006.01)
*G11C 7/22* (2006.01)

(52) U.S. Cl.
CPC .......... *G11C 11/4091* (2013.01); *G11C 7/065* (2013.01); *G11C 7/08* (2013.01); *G11C 7/227* (2013.01)

(58) Field of Classification Search
CPC ....... G11C 11/4091; G11C 7/065; G11C 7/08; G11C 7/227
See application file for complete search history.

(56) References Cited

U.S. PATENT DOCUMENTS

| | | | | |
|---|---|---|---|---|
| 2015/0003146 A1* | 1/2015 | Chun | ............. | G11C 11/404 365/149 |
| 2016/0086652 A1* | 3/2016 | Thewes | ............. | G11C 7/06 365/208 |
| 2023/0143127 A1* | 5/2023 | Rasmus | ............. | H03F 1/0227 330/253 |
| 2023/0308064 A1* | 9/2023 | Fuhs | ............. | H03G 1/0029 |
| 2023/0386545 A1* | 11/2023 | Liu | ............. | G11C 11/221 |

* cited by examiner

*Primary Examiner* — Mushfique Siddique
(74) *Attorney, Agent, or Firm* — Fletcher Yoder, P.C.

(57) ABSTRACT

A memory device includes a memory cell that stores data. The memory device also includes a pair of digit lines that carry the data from the memory cell. The memory device further includes a sense amplifier that senses and amplifies voltages received at the pair of digit lines. The memory device also includes a replica sense amplifier that generates a replica common mode voltage associated with a common mode voltage of the pair of digit lines.

23 Claims, 7 Drawing Sheets

SYSTEMS AND METHODS FOR CONTROLLING COMMON MODE LEVEL FOR SENSE AMPLIFIER CIRCUITRY

BACKGROUND

Field of the Present Disclosure

Embodiments of the present disclosure relate generally to the field of memory devices. More specifically, embodiments of the present disclosure relate to sense amplifier circuitry.

Description of Related Art

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

Generally, a computing system may include electronic devices that, in operation, communicate information via electrical signals. For example, a computing system may include a processor communicatively coupled to a memory device, such as a dynamic random-access memory (DRAM) device implemented on dual in-line memory module (DIMM). In this manner, the processor may communicate with the memory device, for example, to retrieve executable instructions, retrieve data to be processed by the processor, and/or store data output from the processor.

Memory devices receive signals having varying voltage levels during operation. Each signal may have a voltage level located in the common mode range, and each signal may be amplified to be processed in the memory device. Sense amplifiers may be coupled to memory cells of the memory device to detect a charge associated with a bit stored in a memory cell. However, due to the large number of sense amplifiers in the memory device any excess consumption of resources (e.g., power and/or area) in a sense amplifier may impact the efficiency of the memory device's resources. The common mode voltage provided on digit lines to the sense amplifier may be adjusted by the strength of a pull-up or pull-down driver. For example, a control signal may adjust the gate voltages for the pull-up and pull-down drivers. However, the common mode voltage may vary due to process and temperature variations. As such, these variations may increase excess consumption of resources in the sense amplifiers.

Embodiments of the present disclosure may be directed to address one or more of the problems set forth above.

BRIEF DESCRIPTION OF DRAWINGS

Various aspects of this disclosure may be better understood upon reading the following detailed description and upon reference to the drawings in which.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Memory devices receive signals from their memory cells having relatively low voltage levels during read operations. Due to the low voltage levels, even small variations in voltages may be large relative to the low voltage levels. Furthermore, each signal may have a voltage level located in the common mode range, and each signal may be amplified to be processed in the memory device. A sense amplifier may be included in and used by the memory device to detect a charge associated with a bit stored in a memory cell. However, due to the large number of sense amplifiers in the memory device any excess consumption of resources (e.g., power and/or area) in a sense amplifier may impact the efficiency of the memory device's resources. As used herein, "common mode voltage" refers to the average voltage provided as inputs to the sense amplifiers on digit lines from respective memory cells. The common mode voltage provided on digit lines to the sense amplifiers from respective memory cells may be adjusted by the strength of a pull-up or pull-down driver. For example, a control signal may adjust the gate voltages for the pull-up and pull-down drivers. However, the common mode voltage may vary due to process, voltage, and temperature (PVT) variations. As such, these variations may increase excess consumption of resources in the sense amplifier. Accordingly, by tracking and/or mimicking the common mode voltage through PVT variations, a suitable gate voltage level may be provided to the pull-up and/or pull-down drivers in order to reduce excess power consumption in the memory device.

Figure 1:
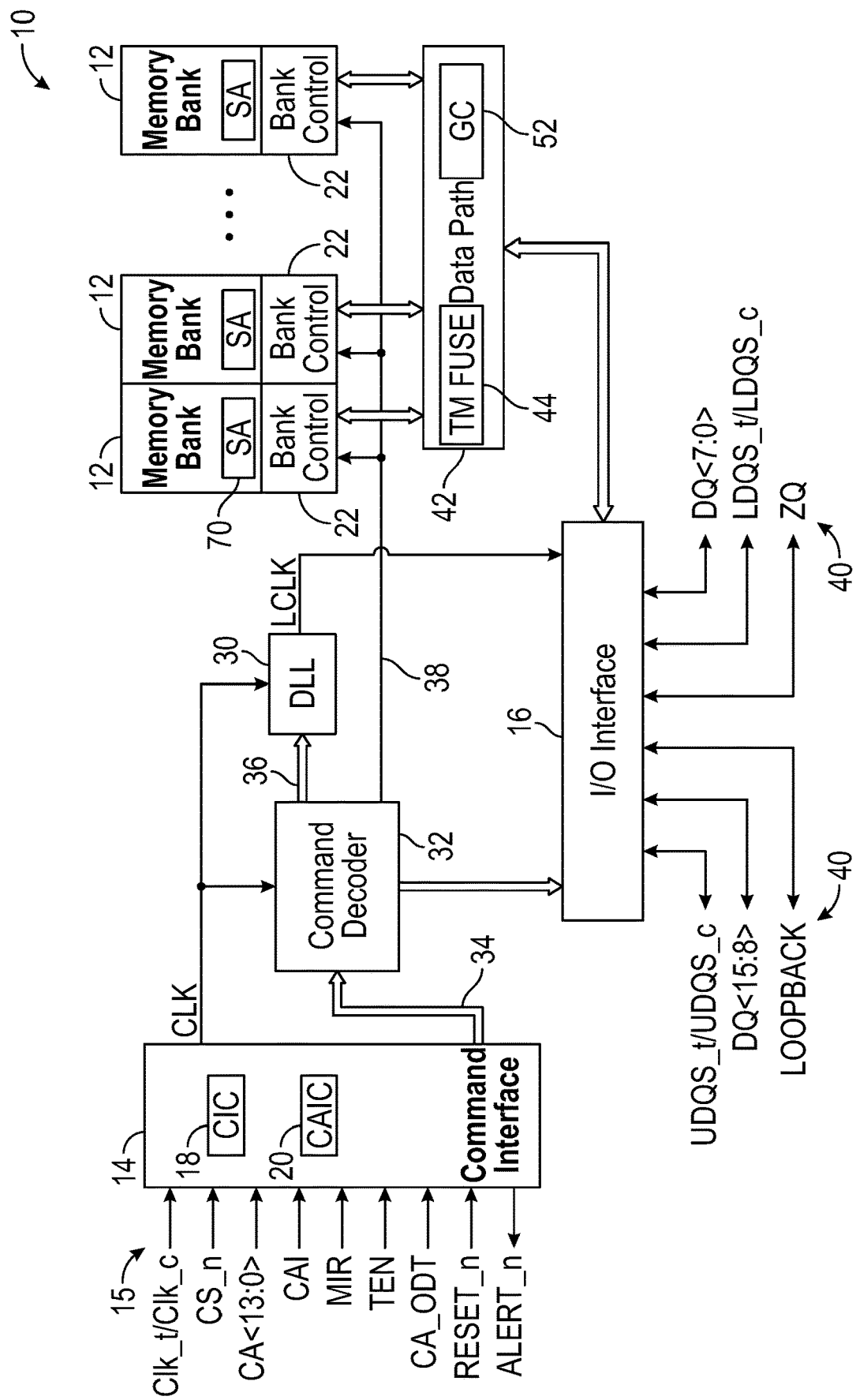
FIG. 1 is a simplified block diagram illustrating certain features of a memory device, according to an embodiment of the disclosure.

FIG. 1 is a simplified block diagram illustrating some features of a memory device 10. In accordance with one embodiment, the memory device 10 may be a double data rate type five synchronous dynamic random access memory (DDR5 SDRAM) device. Various features of DDR5 SDRAM allow for reduced power consumption, increased bandwidth, and increased storage capacity compared to prior generations of DDR SDRAM. The memory device 10 represents a portion of a single memory chip (e.g., SDRAM chip) having a number of memory banks 12. The memory banks 12 may be, for example, DDR5 SDRAM memory banks. The memory banks 12 may be disposed on one or more chips (e.g., SDRAM chips) arranged on dual inline memory modules (DIMMS). Each DIMM may include a number of SDRAM memory chips (e.g., eight or sixteen memory chips). Each SDRAM memory chip may include one or more memory banks 12. In some embodiments, the memory banks 12 may include memory cells to store a single bit of data.

For DDR5, the memory banks 12 may be arranged to form bank groups. For example, the memory chip may include sixteen memory banks 12 for an eight gigabyte (8 Gb) DDR5 SDRAM. The memory banks 12 may be arranged into eight memory bank groups, each memory bank group including two memory banks. For a sixteen gigabyte (16 Gb) DDR5 SDRAM, the memory chip may include thirty-two memory banks 12, arranged into eight memory bank groups, each memory bank group including four memory banks 12, for instance.

Various other configurations, organizations, and sizes of the memory banks 12 on the memory device 10 may be utilized depending on the application and design of the overall system. In one embodiment, each memory bank 12 includes a bank control block 22, which controls execution of commands to and from the memory banks 12 for performing various functionality in the memory device 10, such as decoding, timing control, data control, and any combination thereof.

The memory banks 12 and/or bank control blocks 22 may include sense amplifiers 70. As previously noted, sense amplifiers 70 are used by the memory device 10 during read operations. Specifically, read circuitry of the memory device 10 utilizes the sense amplifiers 70 to receive low voltage (e.g., low differential) signals from the memory cells of the memory banks 12 and amplifies the small voltage differences to enable the memory device 10 to interpret the data properly.

A command interface 14 of the memory device 10 is configured to receive and transmit a number of signals (e.g., signals 15). The signals 15 may be received from an external (e.g., host) device (not shown), such as a processor or controller. The processor or controller may provide various signals 15 to the memory device 10 to facilitate transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t) and the bar/complementary clock signal (Clk_c). A positive clock edge for DDR refers to the point where a rising true clock signal Clk_t crosses a falling complementary clock signal Clk_c. A negative clock edge indicates a transition of a falling true clock signal Clk_t and a rising of the complementary clock signal Clk_c. Commands (e.g., read command, write command, etc.) are typically entered on the positive edges of the clock signal. Data may be transmitted or received on both the positive and the negative clock edges. In certain embodiments, data may be received based on alignment with both the positive and the negative clock edges.

The clock input circuit 18 receives the true clock signal (Clk_t) and the complementary clock signal (Clk_c) and generates an internal clock signal, CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to an I/O interface 16, for instance, and is used as a timing signal for determining an output timing of read data. In some embodiments, the clock input circuit 18 may include circuitry that splits the clock signal into multiple (e.g., four) phases. The clock input circuit 18 may also include phase detection circuitry to detect which phase receives a first pulse when sets of pulses occur too frequently to enable the clock input circuit 18 to reset between pulses.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the I/O interface 16, for instance.

Further, the command decoder 32 may decode incoming commands, such as read commands, write commands, mode-register set commands, activate commands, etc., and provide access to a particular memory bank 12 corresponding to the command via the bus path 38. As will be appreciated, the memory device 10 may include various other decoders, such as row decoders and column decoders, to facilitate access to the memory banks 12.

The memory device 10 executes operations, such as read commands and write commands, based on the command/address signals received from an external device, such as a processor. In one embodiment, the command/address bus 34 may be a 14-bit bus to accommodate the command/address signals (CA<13:0>). The command/address signals 15 are clocked to the command interface 14 using the clock signals (Clk_t and Clk_c). The command interface 14 may include a command address input circuit 20 which is configured to receive and transmit the commands to provide access to the memory banks 12 through the command decoder 32. In addition, the command interface 14 may receive a chip select signal (CS_n). The CS_n signal enables the memory device 10 to process commands on the incoming CA<13:0> bus. Access to specific memory banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus 34, for instance, depending on the command/address routing for the particular memory device 10. A mirror (MIR) signal may also be provided to facilitate a mirror function. The MIR signal may be used to multiplex signals so the signals can be swapped to enable certain routing of signals to the memory device 10, based on the configuration of multiple memory devices (such as memory device 10) in a particular application. Various signals to facilitate testing of the memory device 10, such as the test enable (TEN) signal, may be provided as well. For instance, the TEN signal may be used to place the memory device 10 into a test mode for connectivity testing.

The command interface 14 may also be used to provide an alert signal (ALERT_n) to the system processor or controller for errors that may be detected. For instance, the alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during some operations, such as the connectivity test mode executed using the TEN signal, as described above.

Data may be sent to and from the memory device 10, utilizing the command and clocking signals 15 discussed above, by transmitting and receiving data signals 40 through the I/O interface 16. More specifically, the data may be sent to or retrieved from the memory banks 12 over a datapath 42, which includes a plurality of bi-directional data buses. Data I/O signals, generally referred to as DQ signals, are generally transmitted and received in one or more bi-directional data busses. For particular memory devices, such as a DDR5 SDRAM memory device, the I/O signals may be divided into upper and lower bytes. For instance, for a ×16 memory device, the I/O signals may be divided into upper and lower I/O signals (e.g., DQ<15:8> and DQ<7:0>) corresponding to upper and lower bytes of the data signals, for instance.

To allow for higher data rates within the memory device 10, some memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals may be used as clock signals to capture the corresponding input data. As with the clock signals (Clk_t and Clk_c), the DQS signals may be provided as a differential pair of data strobe signals (DQS_t and DQS_c) to provide differential pair signaling during reads and writes. For some memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

An impedance (ZQ) calibration signal may also be provided to the memory device 10 through the I/O interface 16. The ZQ calibration signal may be provided to a reference pin and used to tune output drivers and ODT values by adjusting pull-up and pull-down resistors of the memory device 10 across changes in process, voltage, and temperature (PVT) values. Because PVT characteristics may affect the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the I/O pins.

In addition, a loopback signal (LOOPBACK) may be provided to the memory device 10 through the I/O interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the I/O interface 16.

The memory device 10 may include generator circuitry 52 that generates and distributes common mode voltages for use in the sense amplifiers 70. The generator circuitry 52 may be included in the I/O interface 16, the datapath 42, and/or any suitable location in the memory device 10. The memory device 10 may also include a test mode fuse 44 that may include a resistive element (e.g., resistor). The test mode fuse 44 may be utilized to provide a signal to a sense amplifier circuit to adjust a reference common mode voltage (e.g., VBLP) based on the target current. In some embodiments, other electrical components may be used in addition or alternative to using a fuse. For instance, a control signal may be generated based on a mode register, software instructions, and/or using any other suitable techniques. Any suitable electrical component (e.g., an antifuse) may store an indication associated with the control signal. For example, circuitry of the memory device 10 may store an indication (e.g., bit code, bit, value) that may be utilized to adjust a target current.

As will be appreciated, various other components such as power supply circuits (for receiving external VDD and VSS signals), mode registers (to define various modes of programmable operations and configurations), read/write amplifiers (e.g., additional sense amplifiers to amplify signals during read/write operations), temperature sensors (for sensing temperatures of the memory device 10), etc., may also be incorporated into the memory device 10. Accordingly, it should be understood that the block diagram of FIG. 1 is provided to highlight some functional features of the memory device 10 to aid in the subsequent detailed description.

Figure 2:
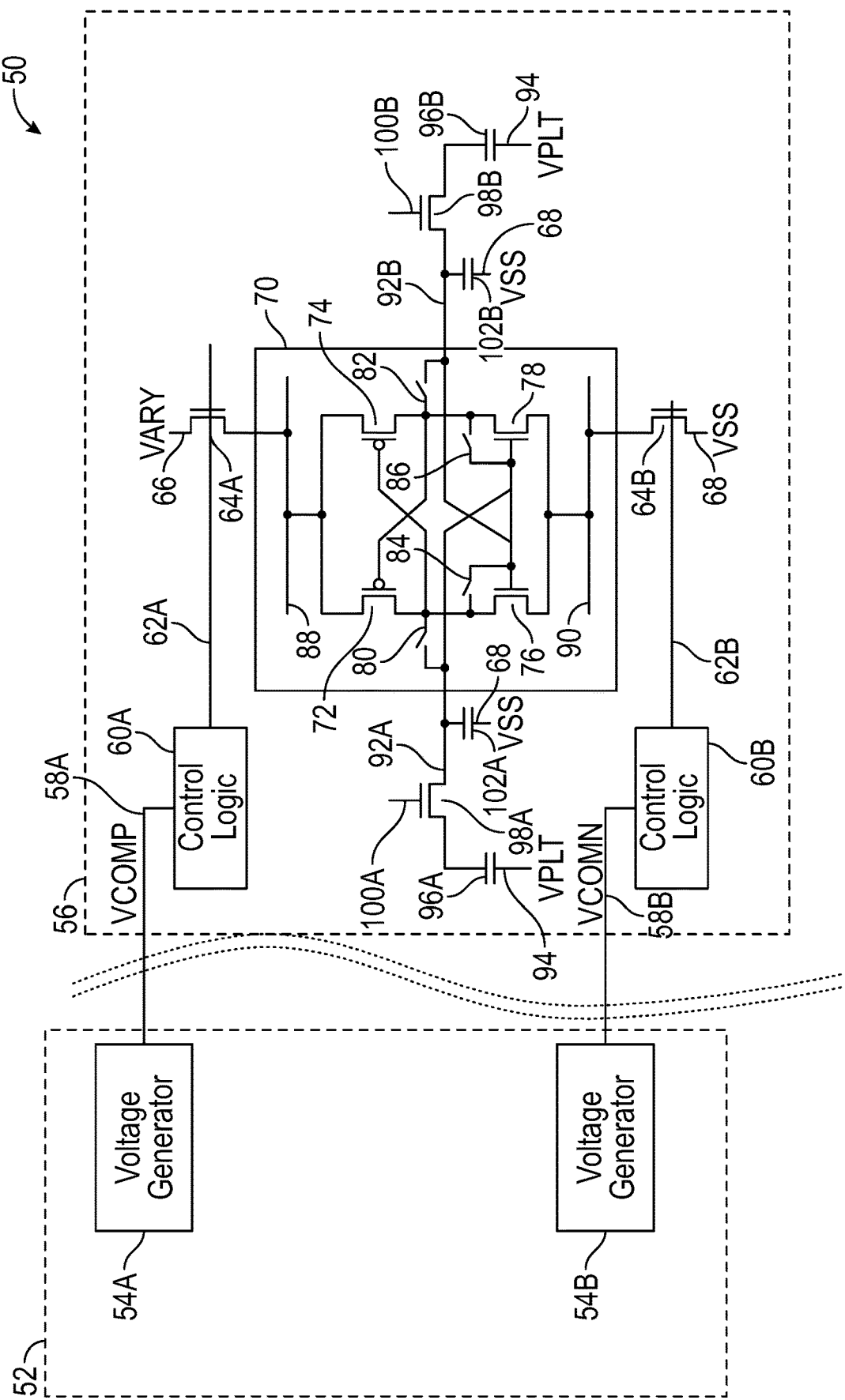
FIG. 2 is a schematic diagram of sense amplifier circuitry, according to an embodiment of the disclosure.

With the foregoing in mind, FIG. 2 is a schematic diagram of sense amplifier circuit 50, in accordance with an embodiment of the present disclosure. The sense amplifier circuit 50 may include generator circuitry 52 and sense amplifier circuitry 56. The generator circuitry 52 may include voltage generators 54A, 54B that supply common mode voltages 58A, 58B, respectively. For example, the first voltage generator 54A supplies a high common mode voltage (VCOMP) 58A and the second voltage generator 54B supplies a low common mode voltage (VCOMN) 58B. As used herein, when "high" and "low" voltages are discussed as a pair, the "high" voltage is more positive than the "low" voltage whether the respective voltages are negative or positive. The control logic 60A, 60B of the sense amplifier circuitry 56 receives the common mode voltages 58A, 58B, respectively, and supplies control logic signals 62A, 62B, respectively that may be utilized to control pull-up driver 64A and pull-down driver 64B, respectively. The control logic 60A, 60B may include circuitry to generate the respective control logic signals. For instance, the control logic 60A, 60B may be implemented using circuitry that implements a hardwarebased control, circuitry (e.g., processor) that implements a software-based control, or a combination thereof. The pull-up driver 64A provides a supply voltage (e.g., VARY (voltage for utilizing an array of memory cells in the memory device)) 66 to the sense amplifier 70. The pull-up driver 64A may be an n-type metal oxide semiconductor (NMOS) transistor that includes a gate terminal coupled to the output of the first control logic 60A that provides the first control logic signal 62A. As such, the pull-up driver 64A may be activated when the first control logic signal 62A is asserted (e.g., high). Likewise, the pull-down driver 64B provides a ground voltage 68 (e.g., VSS) to the sense amplifier 70. The pull-down driver 64B may be an NMOS transistor that may include a gate terminal coupled to the output of the second control logic 60B that provides the second control logic signal 62B. As such, the pull-down driver 64B may be activated when the second control logic signal 62B is asserted (e.g., high).

The sense amplifier circuitry 56 may include the sense amplifier 70. The sense amplifier 70 may include multiple (e.g., 2, 3, 4, and so forth) transistors to direct current flow and assist in determining the logical value of a memory cell of the memory banks 12. For example, reference voltages representing a supply voltage (e.g., supply voltage 66) or ground (e.g., ground voltage 68) may be maintained on reference input control lines 88, 90, respectively. The reference input control lines 88, 90 may drive the sense amplifier 70 to a logical 1 or 0 depending on the input from digit lines 92 (referred to individually as first digit line 92A and second digit line 92B). In certain embodiments, the digit lines 92 may include the first digit line 92A (e.g., representative of the voltage from a memory cell) and a complement digit line or second digit line 92B (e.g., an inverse digit line). In certain embodiments, the common mode voltage may be the average of the input voltages from the digit lines 92. That is, in some embodiments, the common mode voltage may be half of the supply voltage 66. The sense amplifier 70 may include p-type metal oxide semiconductor (PMOS) transistors 72, 74 that are coupled (via the drain terminals) to n-type metal oxide semiconductor (NMOS) transistors 76, 78. The PMOS transistors 72, 74 are coupled to the activation input control line 88 that provides the supply voltage 66. Likewise, the NMOS transistors 76, 78 may be coupled to an N-sense amplifier input control line 90 that provides a reference voltage (e.g., ground voltage 68).

During a receiving stage, the sense amplifier 70 receives data via the digit lines 92. The sense amplifier 70 may also include isolation switches 80, 82 that isolate the digit lines 92 from the PMOS transistors 72, 74 at least in a voltage threshold mismatch compensation (VtC) stage/mode after the receiving stage. For example, in the VtC stage, the isolation switches 80, 82 may be off (e.g., open) and the gate terminals of the PMOS transistors 72, 74 may be disconnected from opposite digit lines 92B, 92A, respectively. In the VtC stage, digit line control switches 84, 86 may be on (e.g., closed) and the gate terminals of the NMOS transistors 76, 78 may be coupled to the drain terminals of the NMOS transistors 76, 78, respectively, to configure the NMOS transistors 76, 78 as diodes and to charge the lines connecting the respective transistors to compensate for VtC. As cross-coupled transistors, the gate terminals of the PMOS transistors 72, 74, may be coupled to digit lines 92A, 92B, respectively. As such, the PMOS transistors 72, 74 may be inactive (e.g., turned off) in the VtC stage, and the NMOS transistors 76, 78 may be active (e.g., turned on) in the VtC stage. Accordingly, in the VtC stage, the digit line control switches 84, 86 may provide a positive feedback path for digit lines 92B, 92A, respectively.

In an internal amplification stage, the digit line control switches 84, 86 may be off (e.g., open) and the gate terminals of the NMOS transistors 76, 78 may be coupled to the opposite digit lines 92B, 92A, respectively. The isolation switches 80, 82 may also remain off (e.g., open) during the amplification. During a subsequent transmission stage, the isolation switches 80, 82 are turned on (e.g., closed) to transmit the amplified and compensated data back out to the digit lines 92. In some embodiments, the VtC stage may be deployed independently of the other described stages.

Additionally, capacitors 96A, 96B, 102A, 102B may operate as filters for a VPLT voltage 94 that may be coupled to the digit lines 92 through transistors 98A, 98B, respectively. The transistors 98A, 98B may be activated when word line signals 100A, 100B, respectively, are asserted (e.g., high).

Figure 3:
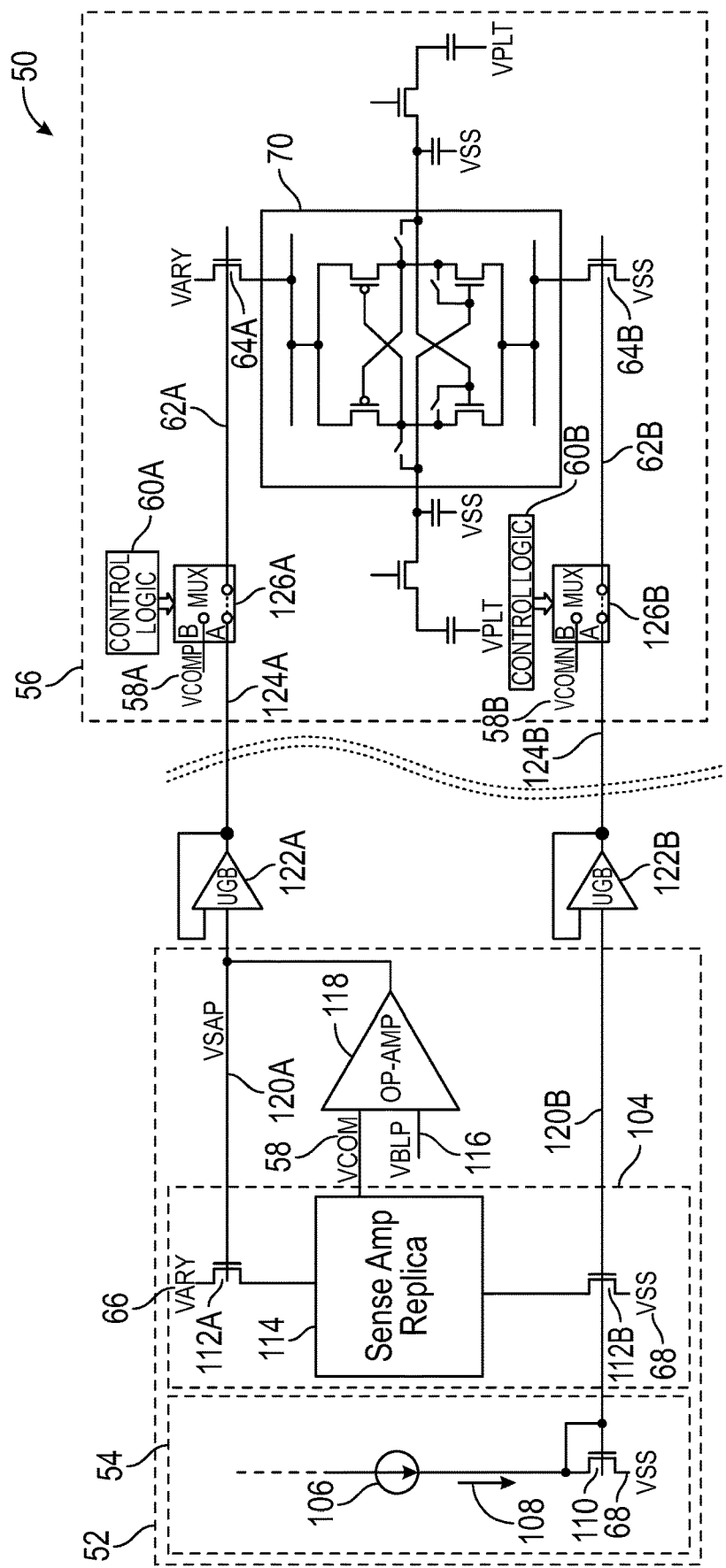
FIG. 3 is a schematic diagram of the sense amplifier circuitry of FIG. 2 having a replica sense amplifier and an NMOS pull-up driver, according to an embodiment of the disclosure.

With the foregoing in mind, FIG. 3 illustrates a schematic diagram of the sense amplifier circuit 50 including a replica sense amplifier 114, in accordance with an embodiment of the present disclosure. The generator circuitry 52 may include a voltage generator 54. The voltage generator 54 may include a target current source 106 that generates a target current 108. The target current 108 may be a constant (e.g., fixed) current independent of process variations, power supply variations, temperature changes, and the like. In certain embodiments, the target current 108 may be set (e.g., adjusted) based on a control signal from the test mode fuse 44. Additionally or alternatively, the target current 108 may be adjusted based on a mode register, software instructions, and/or using any other suitable techniques. In some embodiments, the target current 108 may be generated based on a constant current independent of temperature variations. The voltage generator 54 may also include an NMOS transistor 110 that includes a source terminal coupled to the ground voltage 68. A gate terminal of the NMOS transistor 110 may be coupled to a drain terminal of the NMOS transistor 110.

The sense circuit 104 also includes a replica pull-down driver 112B. The replica pull-down driver 112B may include an NMOS transistor having a source terminal coupled to the ground voltage 68. A drain terminal of the replica pull-down driver 112B may be coupled to a second control line coupled to the replica sense amplifier 114. A gate terminal of the replica pull-down driver 112B may be coupled to the gate terminal of the NMOS transistor 110. A drain terminal of a replica pull-up driver 112A may be coupled to the supply voltage 66. A source terminal of the replica pull-up driver 112A may be coupled to a first control line coupled to the replica sense amplifier 114.

The replica sense amplifier 114 may mimic operation of the sense amplifier 70 and may track the common mode voltage of the digit lines 92 due to the PVT variations through the replica pull-down driver 112B and the replica pull-up driver 112A. As such, the replica sense amplifier 114 may generate a replica common mode voltage 58 that is PVT dependent. In certain embodiments, the replica sense amplifier 114 may include any number of transistors (e.g., 2, 3, 4, and so forth) and a size of each transistor may be proportional (e.g., two times larger, five times larger, ten times larger, one hundred times larger, and so forth) to a size of the PMOS transistors 72, 74 and/or a size of the NMOS transistors 76, 78. The replica sense amplifier 114 may provide the replica common mode voltage 58 to an operational amplifier 118.

The operational amplifier 118 may compare the replica common mode voltage 58 and a reference voltage 116. The operational amplifier 118 may receive the replica common mode voltage 58 as a first input and the reference voltage 116 as a second input. The reference voltage 116 may be PVT independent so that PVT variations of the common mode voltage 58 inversely changes the output of the operational amplifier. In certain embodiments, the reference voltage 116 may be proportional (e.g., half) of the supply voltage 66. The operational amplifier 118 may output a high sense amplifier voltage 120A that may be provided to a gate terminal of the replica pull-up driver 112A. As such, by having the operational amplifier 118 output the high sense amplifier voltage 120A to the gate terminal of the replica pull-up driver 112A, the high sense amplifier voltage 120A may control the replica pull-up driver 112A to provide the supply voltage 66 to the replica sense amplifier 114. Thus, when the difference between the common mode voltage 58 and the reference voltage changes, the voltage at the gate terminal of the replica pull-up driver 112A is changed while the voltage at other terminals (e.g., source terminal, drain terminal) remain unchanged causing the replica pull-up driver 112A to open more fully or close more fully (e.g., to open a channel of the replica pull-up driver 112A more fully or close the channel more fully) and changing the current on the first control line that in turn changes the common mode voltage 58. Accordingly, the replica sense amplifier 114 provides the common mode voltage 58 as a feedback voltage to the operational amplifier 118. Thus, the operational amplifier 118 may generate and/or control the high sense amplifier voltage 120A based on the reference voltage 116.

The target current 108 may control the voltage level of the low sense amplifier voltage 120B. Additionally or alternatively, the test mode fuse 44 may provide a positive or negative voltage offset to the reference voltage 116. For example, a negative voltage offset provided to the reference voltage 116 may decrease the strength of the pull-up driver 64A relative to the pull-down driver 64B. Likewise, a positive voltage offset provided to the reference voltage 116 may increase the strength of the pull-up driver 64A relative to the pull-down driver 64B. In some situations, the sense amplifier replication may be disabled such as by disabling the generator circuitry 52. For example, the test mode fuse 44 may be utilized to provide a signal to enable/disable the replica sense amplifier. In some embodiments, other electrical components may be used in addition or alternative to using a fuse. For instance, a control signal may be generated based on a mode register, software instructions, and/or using any other suitable techniques. Any suitable electrical component may store an indication associated with the control signal. For example, circuitry (e.g., a fuse, an antifuse, a register, etc.) of the memory device 10 may store an indication (e.g., bit code, bit, value) that may be utilized to enable/disable the generator circuitry and/or the replica sense amplifier 114.

The sense amplifier circuit 50 may also include unity gain buffers 122A, 122B that respectively receive the sense amplifier voltages 120A, 120B and respectively output sense amplifier gain voltages 124A, 124B (referred to collectively as sense amplifier gain voltages 124). In certain embodiments, the unity gain buffers 122A, 122B may be operational amplifiers that provide a voltage gain of 1 to an input voltage.

The sense amplifier circuitry 56 may also include multiplexers 126A, 126B (referred to collectively as multiplexers 126) that receive the sense amplifier gain voltages 124A, 124B, respectively. The multiplexers 126 may select the sense amplifier gain voltages 124A, 124B or the common mode voltages 58A, 58B as output to the gate terminal of the pull-up driver 64A or the gate terminal of the pull-down driver 64B, respectively. In certain embodiments, the multiplexer 126A may receive a control signal from the control logic 60A based on an operational mode of the sense amplifier 70. For example, in the sensing mode, the multiplexers 126 may select the common mode voltages 58A, 58B and the multiplexers 126A, 126B may output the common mode voltages 58A, 58B to the gate terminals of the pull-up driver 64A and the pull-down driver 64B, respectively. In the VtC stage, the multiplexers may select the sense amplifier gain voltages 124 and may output the sense amplifier gain voltages 124A, 124B to the gate terminals of the pull-up driver 64A and the pull-down driver 64B, respectively. While FIG. 3 depicts multiplexers 126, the sense amplifier circuitry 56 may include any suitable circuitry, such as a switch, to select the sense amplifier gain voltages 124 or the common mode voltages 58A, 58B based on the operational mode of the sense amplifier 70. Additionally, the PMOS transistors 72, 74 may be active (e.g., turned on) in the VtC stage to maintain the common mode voltages 58A, 58B.

Figure 4:
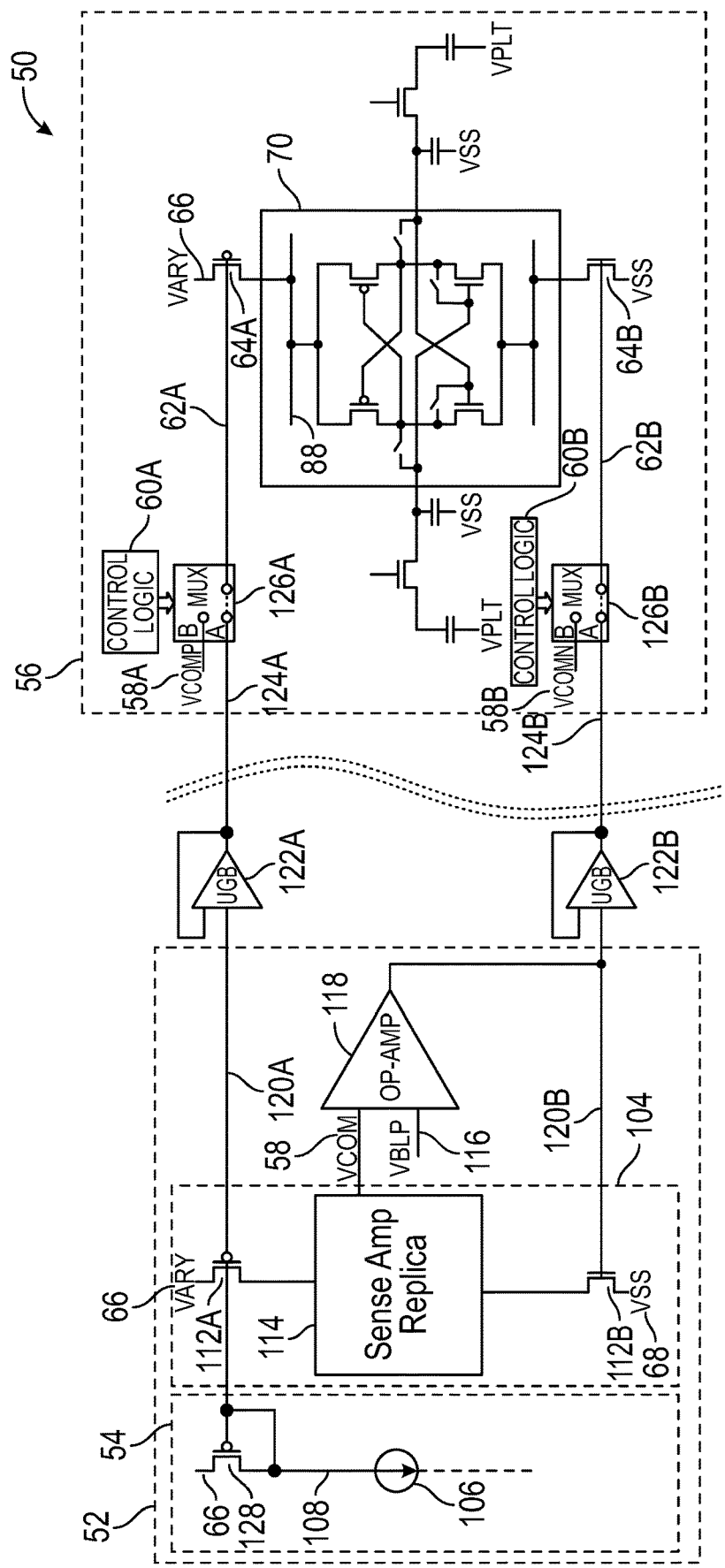
FIG. 4 is a schematic diagram of the sense amplifier circuitry of FIG. 2 having the replica sense amplifier and a PMOS pull-up driver, according to an embodiment of the disclosure.

Alternatively, while FIG. 3 depicts NMOS transistors as the pull-up driver 64A and the replica pull-up driver 112A, the pull-up driver 64A and replica pull-up driver 112A may include PMOS transistors. With the foregoing in mind, FIG. 4 is a schematic diagram of an embodiment of the sense amplifier circuit 50 including the replica sense amplifier 114 that functions similar to the discussion above except that the pull-up driver 64A and the replica pull-up driver 112A include PMOS transistors and the NMOS transistor 110 is replaced by a PMOS transistor 128 in a different but similar location. The voltage generator 54 may include the PMOS transistor 128 that includes a source terminal coupled to the supply voltage 66. A gate terminal of the PMOS transistor 128 may be coupled to a drain terminal of the PMOS transistor 128.

As previously discussed, the sense circuit 104 also includes the replica pull-up driver 112A that includes a PMOS transistor. The replica pull-up driver 112A may have a source terminal coupled to the supply voltage 66. A drain terminal of the replica pull-up driver 112A may be coupled to a first control line coupled to the replica sense amplifier 114. A gate terminal of the replica pull-up driver 112A may be coupled to the gate terminal of the PMOS transistor 128. A source terminal of a replica pull-down driver 112B may be coupled to the ground voltage 68. A drain terminal of the replica pull-down driver 112B may be coupled to a second control line coupled to the replica sense amplifier 114.

The operational amplifier 118 in FIG. 4 outputs the low sense amplifier voltage 120B to the gate terminal of the replica pull-down driver 112B rather than the high sense amplifier voltage 120A to the replica pull-up driver 112A in FIG. 3. As such, by having the operational amplifier 118 output the low sense amplifier voltage 120B to the gate terminal of the replica pull-down driver 112B, the low sense amplifier voltage 120B may control the replica pull-down driver 112B to control the voltage supplied to the replica sense amplifier 114 via the second control line. Accordingly, the replica sense amplifier 114 provides the replica common mode voltage 58 as a feedback voltage to the operational amplifier 118. The target current 108 may control the voltage level of the high sense amplifier voltage 120A. The first unity gain buffer 122A may output the high sense amplifier gain voltage 124A to the multiplexer 126A.

In the VtC stage, the multiplexer 126A may select the high sense amplifier gain voltage 124A and may output the high sense amplifier gain voltage 124A to the gate terminal of the pull-up driver 64A. As shown, the pull-up driver 64A may include a PMOS transistor. The PMOS transistor may include a source terminal coupled to the supply voltage 66 and a drain terminal coupled to the activation input control line 88. As such, the pull-up driver 64A may be activated when the first control logic signal 62A is low.

Regardless of whether the voltage generator 54 and drivers for the sense amplifier 70 use PMOS transistors, the replica sense amplifier 114 tracks PVT variations that cause the operational amplifier 118 and the replica pull-up driver 112A to change at least one voltage from the voltage generator 54 to make the sense amplifier 70 consistent regardless of PVT variations due to the changes of the respective voltages applied to the sense amplifier to compensate for such PVT variations.

Figure 5:
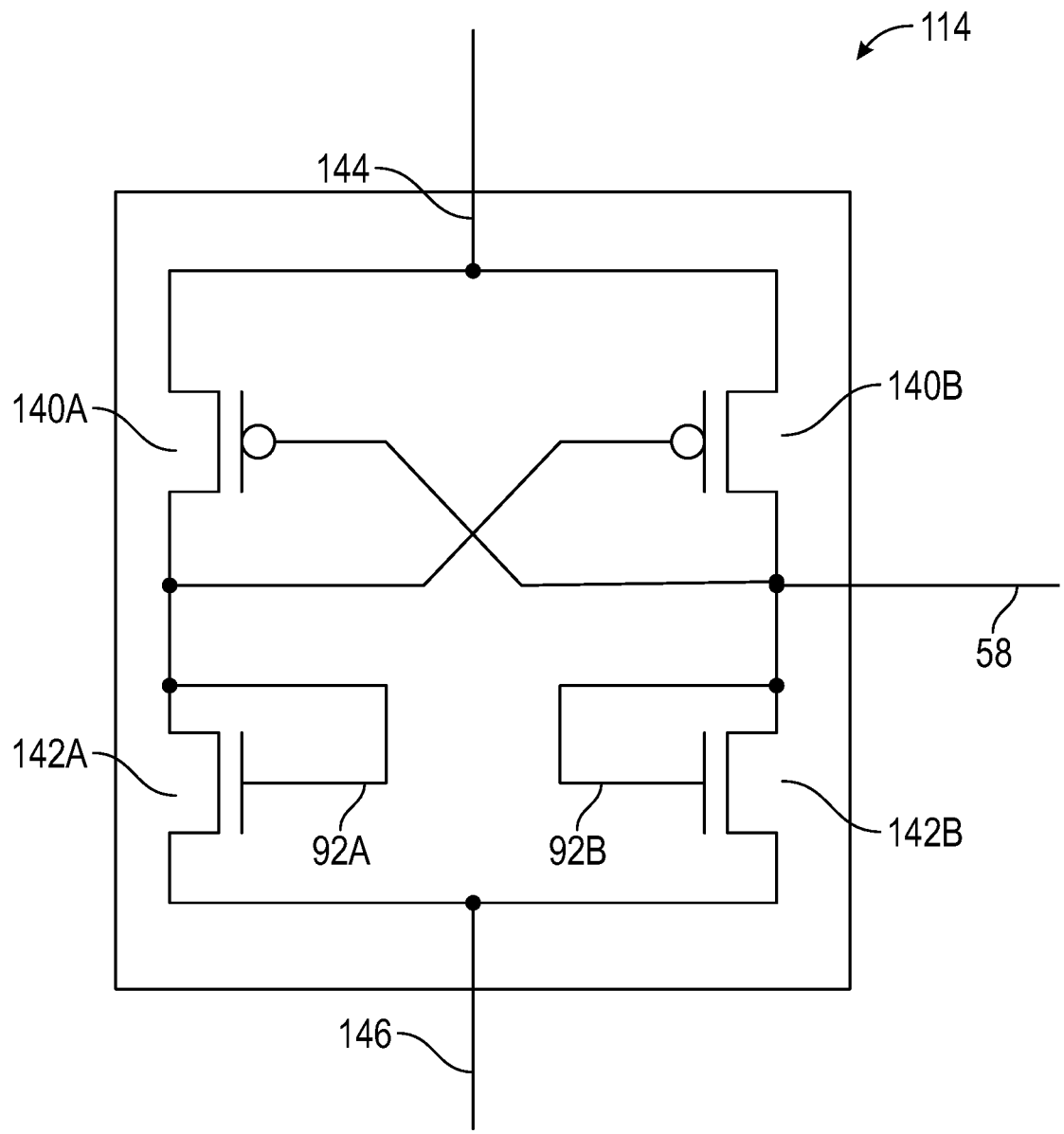
FIG. 5 is a schematic diagram of an embodiment of the replica sense amplifier of FIG. 3, according to an embodiment of the present disclosure.

With the foregoing in mind, FIG. 5 is a schematic diagram of the replica sense amplifier 114, in accordance with an embodiment of the present disclosure. The replica sense amplifier 114 may provide the replica common mode voltage 58 to the operational amplifier 118. The replica sense amplifier 114 may include PMOS transistors 140A, 140B and NMOS transistors 142A, 142B. In certain embodiments, a size of the PMOS transistors 140A, 140B may be proportional (e.g., the same size, two times larger, five times larger, ten times larger, one hundred times larger, and so forth) to a size of the PMOS transistors 72, 74. Additionally or alternatively, a size of the NMOS transistors 142A, 142B may be proportional to a size of the NMOS transistors 76, 78. As such, a local mismatch between the pair of PMOS transistors 140A, 140B and/or the pair of NMOS transistors 142A, 142B may be reduced. A gate terminal of the first PMOS transistor 140A may be coupled to a drain terminal of the second PMOS transistor 140B. Similarly, a gate terminal of the second PMOS transistor 140B may be coupled to a drain terminal of the first PMOS transistor 140A. As such, the PMOS transistors 140A, 140B may be cross-coupled. The gate terminal of the first NMOS transistor 142A may be coupled to the first digit line 92A. The gate terminal of the second NMOS transistor 142B may be coupled to the second digit line 92B. Source terminals of the PMOS transistors 140A, 140B may be coupled to first control line 144. Source terminals of the NMOS transistors 142A, 142B may be coupled to the second control line 146. As such, the replica sense amplifier 114 may mimic the operation of the sense amplifier 70 and may be operated in the VtC stage to match/emulate PVT variations of the sense amplifier 70 to compensate for the PVT variations of the sense amplifier 70.

Figure 6:
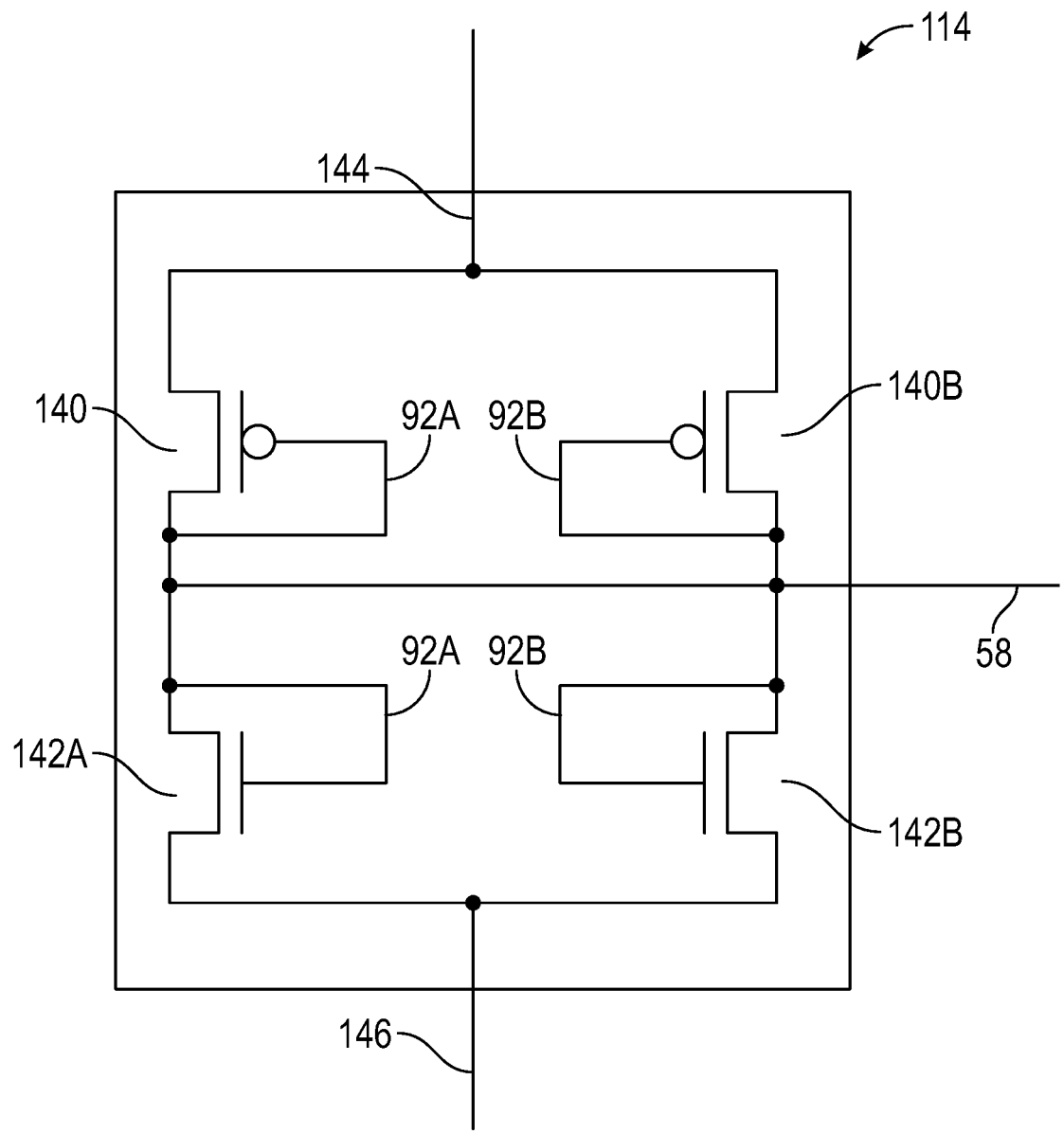
FIG. 6 is a schematic diagram of a second embodiment of the replica sense amplifier of FIG. 3, according to an embodiment of the present disclosure.

FIG. 6 illustrates a schematic diagram of the replica sense amplifier 114, in accordance with another embodiment of the present disclosure. A gate terminal of the first PMOS transistor 140A may be coupled to a drain terminal of the first PMOS transistor 140A. Similarly, a gate terminal of the second PMOS transistor 140B may be coupled to a drain terminal of the second PMOS transistor 140B. A gate terminal of the first NMOS transistor 142A may be coupled to a drain terminal of the first NMOS transistor 142A. Likewise, a gate terminal of the second NMOS transistor 142B may be coupled to a drain terminal of the second NMOS transistor 142B. Source terminals of the PMOS transistors 140A, 140B may be coupled to the first control line 144. Source terminals of the NMOS transistors 142A, 142B may be coupled to the second control line 146.

Figure 7:
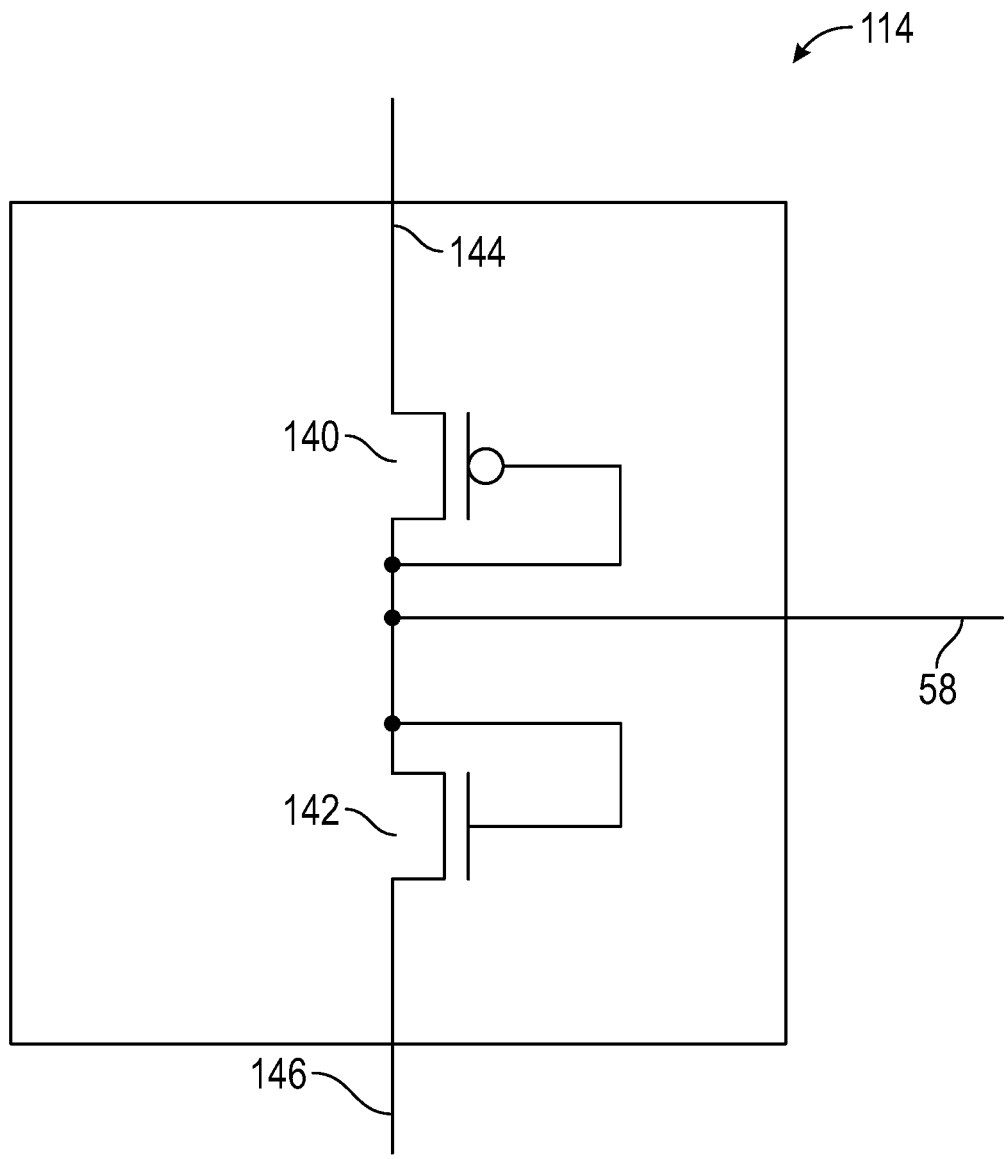
FIG. 7 is a schematic diagram of a third embodiment of the replica sense amplifier of FIG. 3, according to an embodiment of the present disclosure.

FIG. 7 illustrates a schematic diagram of the replica sense amplifier, in accordance with yet another embodiment of the present disclosure. The replica sense amplifier 114 may include a PMOS transistor 140 and an NMOS transistor 142. In certain embodiments, a size of the PMOS transistor 140 may be proportional (e.g., the same size, two times larger, five times larger, ten times larger, one hundred times larger, and so forth or vice versa) to a size of the PMOS transistors 72, 74. A gate terminal of the PMOS transistor 140 may be coupled to a drain terminal of the PMOS transistor 140. Similarly, a gate terminal of the NMOS transistor 142 may be coupled to a drain terminal of the NMOS transistor 142. A source terminal of the PMOS transistor 140 may be coupled to the supply voltage 66 via the replica pull-up driver 112A. A source terminal of the NMOS transistor 142 may be coupled to the ground voltage 68 via the replica pull-down driver 112B. A source terminal of the PMOS transistor 140 may be coupled to the supply voltage 66 provided by the first control line 144. A source terminal of the NMOS transistor 142 may be coupled to ground voltage 68 provided by the second control line 146. As such, the replica sense amplifier 114 may be operated in the VtC stage.

By using the replica sense amplifier 114 to emulate PVT variations in the sense amplifier 70 and changing driving of the sense amplifier 70 based on those emulated PVT, the power consumed via the voltage (VARY) may be reduced (e.g., 16-85%) when compared to memory devices that do not due so. Thus, the technical effects of the present disclosure include reducing power consumption, for example, by tracking and/or mimicking the common mode voltage on digit lines for the sense amplifier 70. The operational amplifier 118 may compare the replica common mode voltage 58 generated by the replica sense amplifier 114 and the reference voltage 116. Additionally, the operational amplifier 118 may be coupled to a driver (e.g., replica pull-up driver 112A, replica pull-down driver 112B) of the replica sense amplifier 114. As such, the operational amplifier 118 may provide negative feedback to the replica sense amplifier 114 to reduce overcompensation and power consumption. An offset (e.g., positive offset, negative offset) may be added to the reference voltage 116 to adjust the driving of the sense amplifier 70 and, thereby, control the common mode voltage of the digit lines 92. The target current 108 may be independent of PVT variations and may be utilized to control the sense amplifier voltages 120A, 120B. Additionally, portions of the generator circuitry 52 may be turned off or disabled to reduce power consumption by, for example, storing information associated with the replica common mode voltage 58, the sense amplifier voltages 120A, 120B, the sense amplifier gain voltages 124A, 124B, and the like and utilizing the stored information to control the sense amplifier voltages 120A, 120B to control the common mode voltage on the digit lines 92.

While only certain features of the present disclosure have been illustrated and described herein, many modifications and changes will occur to those skilled in the art. For example, signal polarity for assertions may be inverted for at least some signals where a logic low is an assertion while a logic high is a de-assertion. It is, therefore, to be understood that the appended claims are intended to cover all such modifications and changes as fall within the true spirit of the embodiments described herein.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f).

However, for any claims containing elements designated in any other manner, it is intended that such elements are not to be interpreted under 35 U.S.C. 112(f).

The invention claimed is:

1. A semiconductor device comprising:
   a sense amplifier configured to sense and amplify voltages received at a pair of digit lines;
   a replica sense amplifier configured to generate a replica common mode voltage associated with a common mode voltage of the pair of digit lines, wherein the replica sense amplifier comprises a first p-type metal oxide semiconductor (PMOS) transistor and a first n-type metal oxide semiconductor (NMOS) transistor, the sense amplifier comprises a second PMOS transistor and a size of the first PMOS transistor is proportional to a size of the second PMOS transistor; and
   an operational amplifier configured to:
      receive the replica common mode voltage at a first input and a reference voltage at a second input; and
      generate a sense amplifier voltage based at least in part on the replica common mode voltage and the reference voltage.

2. The device of claim 1, comprising:
   a pull-up driver configured to provide a supply voltage to the sense amplifier; and
   a multiplexer configured to:
      provide the sense amplifier voltage to the pull-up driver based on a first control signal associated with a first mode of the sense amplifier; and
      provide a high common mode voltage to the pull-up driver based on a second control signal associated with a second mode of the sense amplifier.

3. The device of claim 2, comprising:
   a replica pull-up driver configured to couple the supply voltage to the replica sense amplifier and configured to receive the sense amplifier voltage; and
   a replica pull-down driver configured to couple a ground voltage to the replica sense amplifier.

4. The device of claim 1, comprising:
   a pull-down driver configured to couple a ground voltage to the sense amplifier;
   a multiplexer configured to:
      provide the sense amplifier voltage to the pull-down driver based on a first control signal associated with a first mode of the sense amplifier; and
      provide a low common mode voltage to the pull-down driver based on a second control signal associated with a second mode of the sense amplifier.

5. The device of claim 1, wherein the replica sense amplifier comprises a third PMOS transistor and a third NMOS transistor.

6. The device of claim 1, wherein the size of the first NMOS transistor is greater than the size of the second NMOS transistor.

7. A semiconductor device, comprising:
   a replica sense amplifier configured to generate a replica common mode voltage that mimics a common mode voltage of a sense amplifier;
   an operational amplifier configured to generate a sense amplifier voltage based at least in part on the replica common mode voltage;
   a driver configured to provide a voltage to the sense amplifier based at least in part on the sense amplifier voltage; and
   a multiplexer configured to provide the sense amplifier voltage to the driver during operation of the sense amplifier in a first mode, wherein the multiplexer is configured to provide a high common mode voltage or a low common mode voltage to the driver during operation of the sense amplifier in a second mode.

8. The device of claim 7, comprising:
   a current source configured to generate a target current to control a second sense amplifier voltage;
   a second driver configured to provide a second voltage to the sense amplifier; and
   a second multiplexer configured to provide the second sense amplifier voltage to the second driver during operation of the sense amplifier in the first mode.

9. The device of claim 7, wherein the driver comprises a p-type metal oxide semiconductor (PMOS) transistor.

10. The device of claim 7, wherein the driver comprises an n-type metal oxide semiconductor (NMOS) transistor.

11. The device of claim 7, wherein mimicking the common mode voltage comprises mimicking process, voltage, and temperature variations in the sense amplifier in the replica sense amplifier, and generating the sense amplifier voltage at least partially compensates for the process, voltage, and temperature variations in the sense amplifier.

12. A memory device, comprising:
   a memory cell configured to store data;
   a pair of digit lines configured to carry the data from the memory cell;
   a sense amplifier configured to sense and amplify voltages received at the pair of digit lines; and
   a replica sense amplifier configured to generate a replica common mode voltage associated with a common mode voltage of the sense amplifier and to cause the sense amplifier to be driven based at least in part on the replica common mode voltage, wherein the replica sense amplifier comprises a pair of p-type metal oxide semiconductor (PMOS) transistors and wherein the pair of PMOS transistors are cross-coupled.

13. The memory device of claim 12, comprising an operational amplifier configured to:
   receive the replica common mode voltage at a first input and a reference voltage at a second input; and
   generate a sense amplifier voltage based at least in part on the replica common mode voltage and the reference voltage.

14. The memory device of claim 13, comprising:
   a pull-down driver configured to couple a ground voltage to the sense amplifier; and
   a multiplexer configured to:
      provide the sense amplifier voltage to the pull-down driver based on a control signal indicating a first mode of the sense amplifier; and
      provide a low common mode voltage to the pull-down driver based on the control signal indicating a second mode of the sense amplifier.

15. The memory device of claim 12, comprising:
   a pull-up driver configured to couple a supply voltage to the sense amplifier;
   a current source configured to generate a target current to control a sense amplifier voltage; and
   a multiplexer configured to:
      provide the sense amplifier voltage to the pull-up driver based on a control signal indicating a first mode of the sense amplifier; and
      provide a high common mode voltage to the pull-up driver based on the control signal indicating a second mode of the sense amplifier.

16. The memory device of claim 15, wherein the pull-up driver comprises a p-type metal oxide semiconductor (PMOS) transistor.

17. The memory device of claim 15, wherein the pull-up driver comprises a n-type metal oxide semiconductor (NMOS) transistor.

18. The memory device of claim 12, wherein the replica common mode voltage is configured to emulate process, voltage, and temperature changes in the sense amplifier and to cause the sense amplifier to be driven based at least in part on the emulated process, voltage, and temperature changes of the sense amplifier emulated in the replica sense amplifier.

19. The memory device of claim 18, comprising a replica driver configured to control a voltage level in the replica sense amplifier used in generating sense amplifier voltage.

20. The memory device of claim 19, wherein the replica driver comprises a transistor and the sense amplifier voltage is fed back to a gate terminal of the transistor to change the voltage level by changing an amount of charge flowing across the transistor.

21. The memory device of claim 20, comprising a driver used to provide a voltage to the sense amplifier based at least in part on the sense amplifier voltage.

22. The memory device of claim 21, wherein the driver comprises a transistor that receives the sense amplifier voltage at its gate terminal to control how much charge flows through the transistor into the sense amplifier.

23. The memory device of claim 12, wherein the replica sense amplifier comprises a pair of n-type metal oxide semiconductor (NMOS) transistors and wherein the pair of NMOS transistors are in a diode configuration.

* * * * *